(12) United States Patent
Stingu et al.

(10) Patent No.: US 11,394,242 B2
(45) Date of Patent: Jul. 19, 2022

(54) WIRELESS POWER TRANSFER IN-BAND COMMUNICATION CIRCUIT AND METHOD

(71) Applicant: Spark Connected LLC, Dallas, TX (US)

(72) Inventors: Petru Emanuel Stingu, Dallas, TX (US); Kenneth Moore, Dallas, TX (US); Yulong Hou, Farmers Branch, TX (US); Ruwanga Dassanayake, Dallas, TX (US)

(73) Assignee: SPARK CONNECTED LLC, Dallas, TX (US)

( * ) Notice: Subject to any disclaimer, the term of this patent is extended or adjusted under 35 U.S.C. 154(b) by 0 days.

(21) Appl. No.: 17/020,494

(22) Filed: Sep. 14, 2020

(65) Prior Publication Data

US 2021/0083528 A1 Mar. 18, 2021

Related U.S. Application Data

(60) Provisional application No. 62/899,607, filed on Sep. 12, 2019.

(51) Int. Cl.
| | |
|---|---|
| *H02J 50/12* | (2016.01) |
| *H02M 3/158* | (2006.01) |
| *H02J 50/80* | (2016.01) |
| *H02J 50/10* | (2016.01) |
| *H02J 50/00* | (2016.01) |

(Continued)

(52) U.S. Cl.
CPC ............. *H02J 50/12* (2016.02); *A47B 21/06* (2013.01); *G01R 33/0094* (2013.01); *G01R 33/0206* (2013.01); *G01R 33/07* (2013.01); *G01R 33/10* (2013.01); *G06F 1/189* (2013.01); *H02J 50/005* (2020.01); *H02J 50/10* (2016.02); *H02J 50/60* (2016.02); *H02J 50/80* (2016.02);

(Continued)

(58) Field of Classification Search
CPC ............ H02J 50/80; H02J 50/10; H02J 50/12; H02M 3/1582
USPC ....................................................... 307/149
See application file for complete search history.

(56) References Cited

U.S. PATENT DOCUMENTS

| | | |
|---|---|---|
| 3,376,578 A | 4/1968 | Sawyer |
| 3,735,231 A | 5/1973 | Sawyer |

(Continued)

OTHER PUBLICATIONS

Consumer Reports, "Wireless charging pad review We tested four popular pads to see whether they really make your life easier", Wireless Charging Pad Reviews, Dec. 11, 2013, 5 pages.

(Continued)

*Primary Examiner* — Alfonso Perez Borroto
(74) *Attorney, Agent, or Firm* — Slater Matsil, LLP

(57) ABSTRACT

In an embodiment, a method for transmitting data from a wireless power receiver to a wireless power transmitter includes: wirelessly receiving power at a first frequency from a transmitter LC tank using a receiver LC tank; rectifying a voltage of the receiver LC tank using a rectifier; and while wirelessly receiving power, controlling a transistor coupled to the receiver LC tank to cause inflections in a transmitter current flowing through the transmitter LC tank to transmit data, detecting time locations of the inflections of the transmitter current within an oscillating cycle of the transmitter current based on a magnitude of the transmitter current, and determining the data based on the detected time locations.

22 Claims, 7 Drawing Sheets

(51) Int. Cl.
*A47B 21/06* (2006.01)
*G06F 1/18* (2006.01)
*H02J 50/60* (2016.01)
*G01R 33/00* (2006.01)
*G01R 33/02* (2006.01)
*G01R 33/07* (2006.01)
*G01R 33/10* (2006.01)

(52) U.S. Cl.
CPC ..... *H02M 3/1582* (2013.01); *A47B 2021/066* (2013.01); *A47B 2200/008* (2013.01)

(56) References Cited

U.S. PATENT DOCUMENTS

| | | | |
|---|---|---|---|
| 4,860,183 | A | 8/1989 | Maeda et al. |
| 5,434,504 | A | 7/1995 | Hollis et al. |
| 5,498,948 | A | 3/1996 | Bruni et al. |
| 6,175,169 | B1 | 1/2001 | Hollis, Jr. et al. |
| 6,184,651 | B1 | 2/2001 | Fernandez et al. |
| 6,445,093 | B1 | 9/2002 | Binnard |
| 6,803,744 | B1 | 10/2004 | Sabo |
| 6,949,845 | B2 | 9/2005 | Oisugi et al. |
| 8,049,370 | B2 | 11/2011 | Azancot et al. |
| 8,193,769 | B2 | 6/2012 | Azancot et al. |
| 8,957,549 | B2 | 2/2015 | Kesler et al. |
| 9,590,444 | B2 | 3/2017 | Walley et al. |
| 9,800,191 | B2 | 10/2017 | Barsilai et al. |
| 9,853,441 | B2 | 12/2017 | Teggatz et al. |
| 10,054,622 | B2 | 8/2018 | Hernandez et al. |
| 10,079,090 | B2 * | 9/2018 | Teggatz ............... H04B 5/0037 |
| 10,168,443 | B2 | 1/2019 | Mangano et al. |
| 2006/0061323 | A1 | 3/2006 | Cheng et al. |
| 2010/0171369 | A1 * | 7/2010 | Baarman ............ G06K 19/0707 307/104 |
| 2010/0181841 | A1 | 7/2010 | Azancot et al. |
| 2010/0219183 | A1 | 9/2010 | Azancot et al. |
| 2010/0244579 | A1 | 9/2010 | Sogabe et al. |
| 2011/0050164 | A1 | 3/2011 | Partovi et al. |
| 2011/0062793 | A1 | 3/2011 | Azancot et al. |
| 2011/0074344 | A1 | 3/2011 | Park et al. |
| 2011/0121660 | A1 | 5/2011 | Azancot et al. |
| 2011/0227527 | A1 | 9/2011 | Zhu et al. |
| 2012/0032632 | A1 | 2/2012 | Soar |
| 2013/0049484 | A1 | 2/2013 | Weissentern et al. |
| 2013/0082651 | A1 | 4/2013 | Park et al. |
| 2013/0257172 | A1 | 10/2013 | Teggatz et al. |
| 2013/0264973 | A1 | 10/2013 | Garg et al. |
| 2013/0285601 | A1 | 10/2013 | Sookprasong et al. |
| 2013/0300204 | A1 | 11/2013 | Partovi |
| 2014/0080409 | A1 | 3/2014 | Frankland et al. |
| 2014/0184150 | A1 | 7/2014 | Walley |
| 2015/0115877 | A1 | 4/2015 | Arai et al. |
| 2015/0142348 | A1 | 5/2015 | Huang et al. |
| 2015/0249484 | A1 | 9/2015 | Mach et al. |
| 2015/0341087 | A1 | 11/2015 | Moore et al. |
| 2016/0149440 | A1 | 5/2016 | Staring et al. |
| 2017/0163100 | A1 | 6/2017 | Vocke et al. |
| 2018/0301942 | A1 * | 10/2018 | Brohlin .................. H02J 7/045 |
| 2019/0109498 | A1 | 4/2019 | Stingu et al. |
| 2019/0190320 | A1 | 6/2019 | Park |
| 2019/0214842 | A1 * | 7/2019 | Wheeland ............... H02J 50/10 |
| 2019/0319494 | A1 | 10/2019 | Park et al. |
| 2019/0334388 | A1 | 10/2019 | Van Wageningen et al. |

OTHER PUBLICATIONS

Digi-Key Electronics, "Inductive Versus Resonant Wireless Charging: A Truce May Be a Designer's Best Choice", Aug. 2, 2016, 8 pages.
Gao, Xiang, "Demodulating Communication Signals of Qi-Compliant Low-Power Wireless Charger Using MC56F8006 DSC", NXP Freescale Semiconductor Application Note, Document No. AN4701, Rev. 0, Mar. 2013, 21 pages.
Jansen, J. W., et al., "Overview of analytical models for the design of linear and planar motors", TU/e Eindhoven University of Technology, DOI: 10.1109/TMAG/2014.2328556, Jan. 1, 2014, 8 pages.
Johns, Bill et al., "Adapting Qi-compliant wireless-power solutions to low-power wearable products", Texas Instruments, High-Performance Analog Products, 2Q, 2014, Analog Applications Journal, 7 pages.
Kot, Thomas, "LC Sensor Rotation Detection with MSP430 Extended Scan Interface (ESI)", Texas Instruments, Application Report, SLAA639, Jul. 2014, 33 pages.
Lynch, Brian T., "Under the Hood of a DC/DC Boost Converter", Texas Instruments, Texas Instruments, Power Supply Design Seminar, Paper SEM1800, Dallas, TX, USA, 2008-2009, 26 pages.
Rice, John, "Examining Wireless Power Transfer", Texas Instruments, 2014/2015 Power Supply Design Seminar, 38 pages.
Texas Instruments "Industry-Leading Wireless Power Solutions—The Most Widely Adopted in the Market", ti.com/wirelesspower, SLYT485C, 3 pages.
Texas Instruments, "Introduction to Wireless Power", QI WPC 1.1 compliant, www.ti.com/wirelesspower, 49 pages.
Waters, Benjamin et al., "Optimal Coil Size Ratios for Wireless Power Transfer Applications", IEEE International Symposium on Circuits and Systems (ISCAS), Jun. 1-5, 2014, 4 pages.
Wikipedia, "Electromagnetic coil", https://en.wikipedia.org/w/index.php?title=Electromagnetic_coil&oldid=776415501, Apr. 2017, 6 pages.
Wikipedia, "Inductive charging", https://en.wikipedia.org/w/index.php?title=Inductive_charging&oldid=802615270, Sep. 2017, 7 pages.
Wikipedia, "Qi (standard)", https://en.wikipedia.org/w/index.php?title=Qi_(standard)&oldid=803427516, Oct. 2017, 5 pages.
ZENS, "ZENS First Worldwide to Introduce Built-in Wireless (Sub-)Surface Charger with Apple and Samsung Fast Charge", Jan. 24, 2019, 5 pages.

* cited by examiner

PRIOR ART

WIRELESS POWER TRANSFER IN-BAND COMMUNICATION CIRCUIT AND METHOD

CROSS-REFERENCE TO RELATED APPLICATIONS

This application claims the benefit of U.S. Provisional Application No. 62/899,607, entitled "Wireless Charging Circuit and Method," and filed on Sep. 12, 2019, which application is hereby incorporated herein by reference.

This application is filed concurrently with U.S. patent application Ser. No. 17/020,326, U.S. patent application Ser. No. 17/020,546, and U.S. patent application Ser. No. 17/020,537, each of which claim the benefit of U.S. Provisional Application No. 62/899,607, which applications are hereby incorporated herein by reference.

TECHNICAL FIELD

The present disclosure relates generally to an electronic system and method, and, in particular embodiments, to a wireless power transfer in-band communication circuit and method.

BACKGROUND

Wireless charging systems are becoming ubiquitous in today's society. For example, many smartphones and wearables implement wireless charging technology. Ease of use, greater reliability, spatial freedom, reduced connectors and openings, and the possibility of hermetically sealing are among the benefits offered by wireless charging. Wireless charging standards allow for interoperability between different devices and manufacturers. Some wireless charging standards, such as the Qi standard from the Wireless Power Consortium, and standards promoted by the AirFuel alliance, are becoming widely adopted. The Qi standard uses inductive charging operating between 80 kHz and 300 kHz to wirelessly transmit power from a transmitter to a receiver. Standards promoted by the AirFuel alliance use resonant wireless charging operating at 6.78 MHz to wirelessly transmit power from a transmitter to a receiver.

FIG. 1 shows exemplary wireless charging system 100. Wireless charging system wo includes a transmitter (TX) device 102 that includes a transmitter coil $L_{TX}$, and a receiver (RX) device 104 that includes a receiver coil $L_{RX}$. The efficiency of the wireless power transmission generally depends on the coupling between the coil $L_{TX}$ and coil $L_{RX}$. The coupling between the coil $L_{TX}$ and coil is generally based on the relative position between the coil $L_{TX}$ and coil $L_{RX}$.

SUMMARY

In accordance with an embodiment, a method for transmitting data from a wireless power receiver to a wireless power transmitter includes: wirelessly receiving power at a first frequency from a transmitter LC tank using a receiver LC tank; rectifying a voltage of the receiver LC tank using a rectifier; and while wirelessly receiving power, controlling a transistor coupled to the receiver LC tank to cause inflections in a transmitter current flowing through the transmitter LC tank to transmit data, detecting time locations of the inflections of the transmitter current within an oscillating cycle of the transmitter current based on a magnitude of the transmitter current, and determining the data based on the detected time locations.

In accordance with an embodiment, a method for transmitting data from a wireless power receiver to a wireless power transmitter includes: wirelessly receiving power using a receiver LC tank from a transmitter LC tank; rectifying a voltage of the receiver LC tank using a synchronous rectifier; and transmitting data from the wireless power receiver to the wireless power transmitter by delaying a switching of the synchronous rectifier by a first time.

In accordance with an embodiment, a wireless power receiver includes: a receiver LC tank configured to receive power from a wireless power transmitter; a synchronous rectifier coupled to the receiver LC tank; and a controller configured to operate the synchronous rectifier to rectify a voltage across terminals of the receiver LC tank to produce a rectified voltage, and to transmit data to the wireless power transmitter by delaying or advancing a switching of the synchronous rectifier by a first time.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, in-band communication from a wireless power receiver to a wireless power transmitter. Some embodiments may be implemented using different wireless power transmitter and/or receiver circuits.

It is understood that the term wireless charging is not limited to the charging of a battery, but includes wireless power transmission generally, unless stated otherwise.

In an embodiment of the present invention, a wireless power receiver transmits data to a wireless power transmitter, in-band, at the switching frequency of the wireless power transmitter by modulating the timing of the switching of a synchronous rectifier coupled to the receiver LC tank. By operating at frequencies higher than conventional in-band wireless power transfer communication, some embodiments achieve higher signal-to-noise ratio (SNR) and may be less susceptible to hacking, e.g., by a malicious app.

Figure 1:
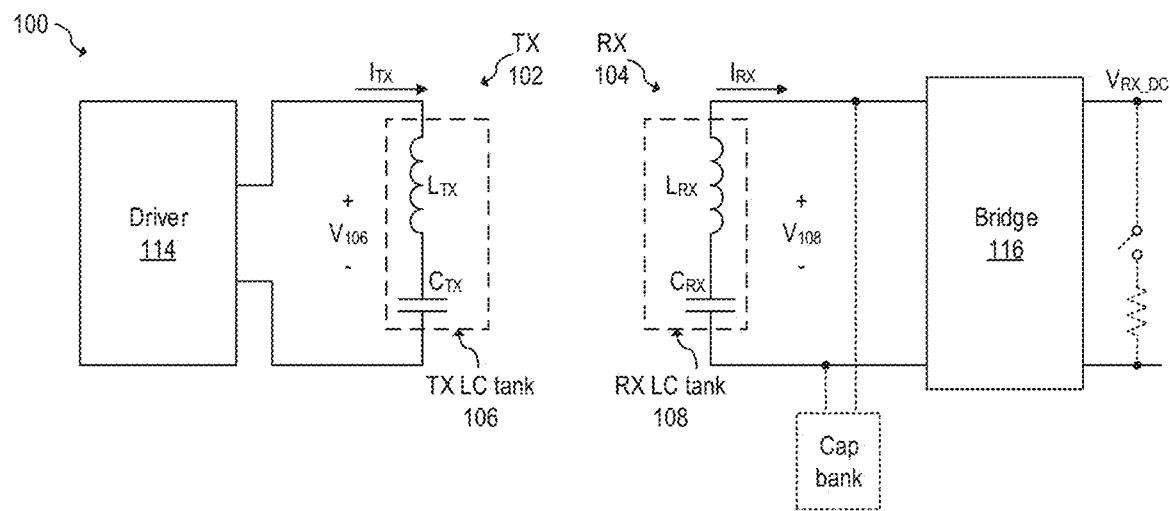
FIG. 1 shows an exemplary wireless charging system.

Communication between a wireless power receiver (e.g., 104) and a wireless power transmitter (e.g., 102) is an important aspect of wireless power transfer. Conventional in-band communication between a wireless power receiver and a wireless power transmitter may be performed, e.g., by load modulation at 1 kHz to 2 kHz (e.g., by modulating the amount of power drawn from RX LC tank 108 by using a capacitor bank connected to the RX LC tank 108 or a resistor connected to the output of bridge 116, as shown in FIG. 1). However, such communication may be prone to hacking. For example, a malicious app may turn on and off a processor of a phone to cause it to consume spikes of currents at the 1 kHz to 2 kHz frequencies in a manner such as to indicate to the wireless power transmitter to increase power. Such method may allow an app to create a dangerous condition, such as burning or substantially damaging a device.

Wireless power receivers (e.g., 104) generally use a filtering capacitor coupled to the output to the bridge (e.g., 116) to filter the switching frequency, which may be, e.g., around 100 kHz. Load transients generated by a load coupled to the output of the rectifier (e.g., 116) and producing effects at lower frequencies, such as at the frequencies of conventional in-band communication (e.g., 1 kHz to 2 kHz) may not be filtered by the filtering capacitor and may disturb in-band communication at conventional in-band frequencies (e.g., 1 kHz to 2 kHz).

Although it is theoretically possible to introduce a filtering capacitor to filter the 1 kHz to 2 kHz signal, the value of such capacitor may be too large to be implemented in practice in some applications.

In some embodiments, in-band communication from the wireless power receiver to the wireless power transmitter is advantageously carried out at frequencies that are capable of being filtered by the filtering capacitor (e.g., at the switching frequency of the wireless power transmitter). In some embodiments, a synchronous rectifier used for rectifying a voltage (e.g., $V_{108}$) from the receiver LC tank (e.g., 108) is also used to transfer data in-band. By allowing the filtering capacitor to filter noise, e.g., caused by a loading circuit coupled to the output of the synchronous rectifier, some embodiments achieve a higher SNR.

Figure 2A:
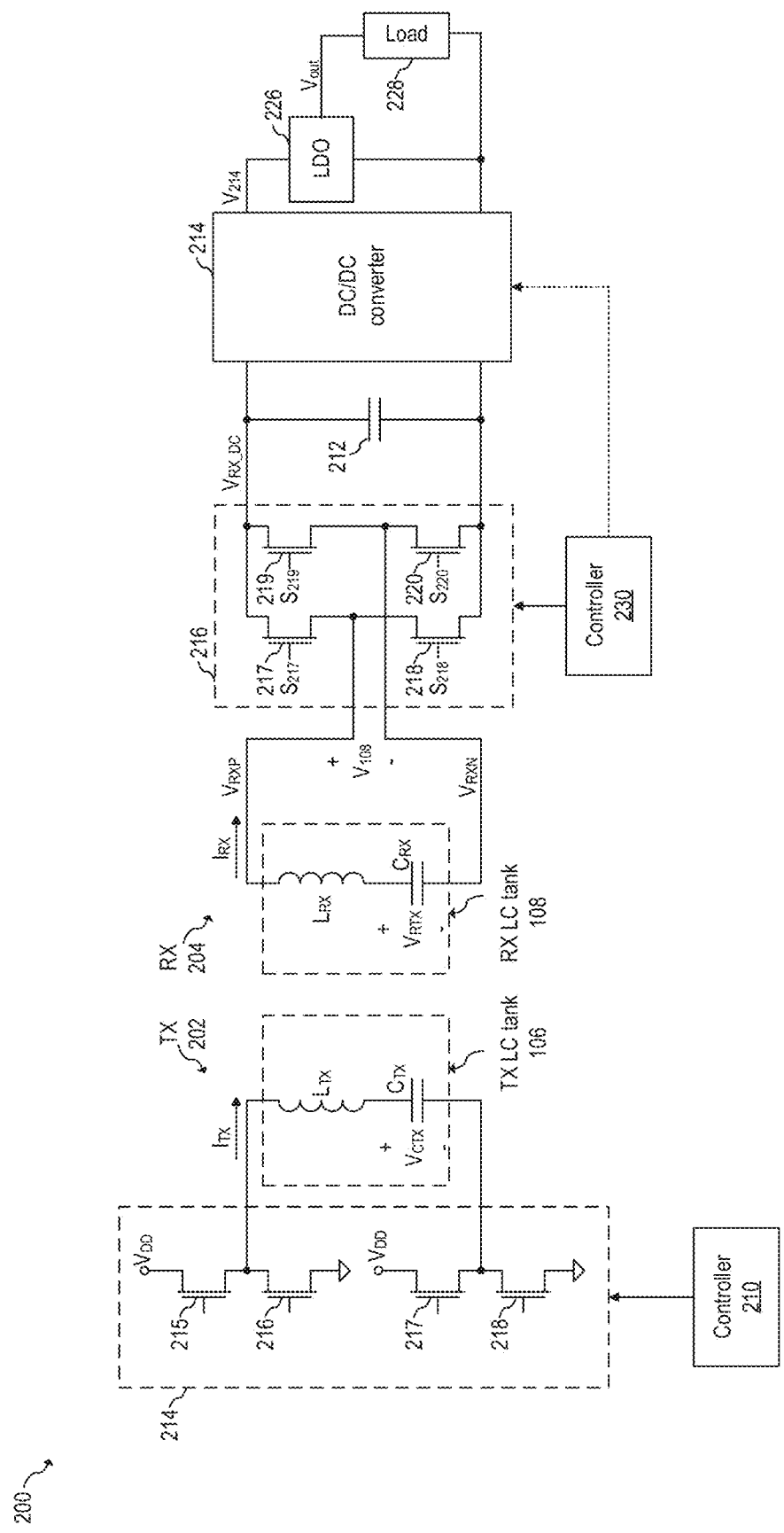
FIG. 2A shows a wireless power receiver, according to an embodiment of the present invention.

FIG. 2A shows wireless charging system 200, according to an embodiment of the present invention. Wireless charging system includes wireless power transmitter 202 and wireless power receiver 204.

During normal operation, controller 210 controls transistors 215, 216, 217, and 218 to generate a current $I_{TX}$ having a frequency, e.g., between 80 kHz and 300 kHz, such as 100 kHz. The magnetic field generated by transmitter coil $L_{TX}$ as a result of the flow of current $I_{TX}$ induces current $I_{RX}$ to flow through LC tank 108. Voltage $V_{108}$ generated across terminals of RX LC tank 108 is rectified by synchronous rectifier 216 to produce rectified voltage $V_{RX\_DC}$. Filtering capacitor 212 may be used to remove fluctuations of voltage $V_{RX\_DC}$ at the switching (operating) frequency of the wireless power receiver (e.g., 100 kHz to 300 kHz).

Figure 2B:
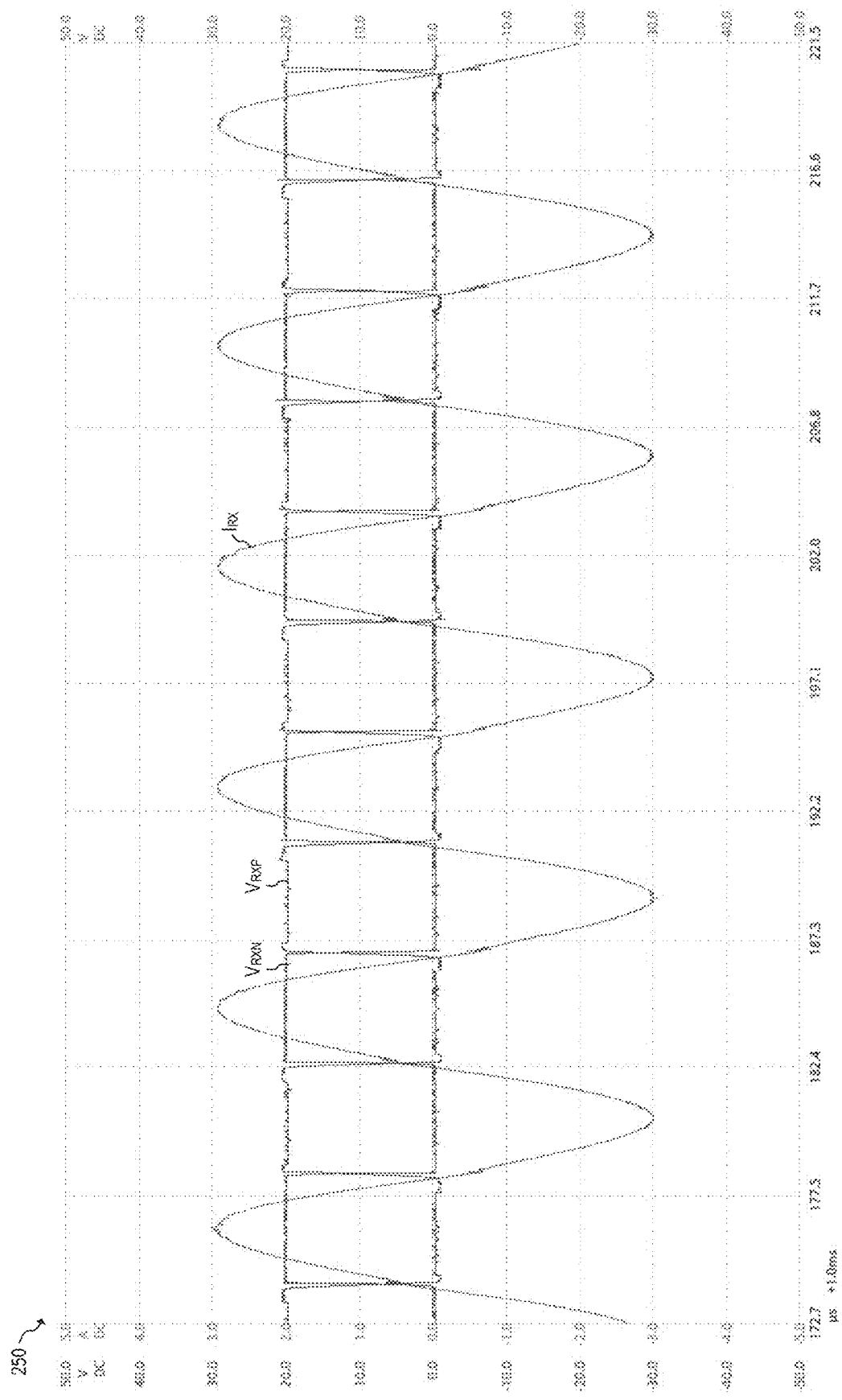
FIG. 2B shows waveforms associated with the LC tank of the wireless power receiver of FIG. 2A during active wireless power transfer, according to an embodiment of the present invention.

FIG. 2B shows waveforms 250 associated with LC tank 108 during active wireless power transfer, according to an embodiment of the present invention.

In some embodiments, the rectified voltage $V_{RX\_DC}$ is used to power load 228, e.g., via a DC/DC converter 214 followed by LDO 226.

In some embodiments, DC/DC converter 214 may be implemented as a boost, buck-boost, or buck converter. Other implementations, such as a fly-back converter, may also be used.

Load 228 may be, e.g., a custom or general purpose microcontroller, a battery charger, or other electronic circuit, such as other digital, analog, or mixed signal circuit, such as amplifiers, power management circuits, audio circuits, etc. For example, in some embodiments, load 228 is a power converter, e.g., for powering other circuits.

LDO 226 may be implemented in any way known in the art, such as by using a regulation transistor to couple voltage $V_{214}$ to voltage $V_{out}$, and an amplifier in a feedback network that senses output voltage $V_{out}$ and controls the control terminal of the regulation transistor to provide a regulated output voltage $V_{out}$. Other implementations are possible.

In some embodiments, other converters may be used instead of, or in addition to LDO 226. For example, in some embodiments, a switching regulator may be used instead of LDO 226. In some embodiments, voltage $V_{214}$ is provided directly to load 228 without an intervening power converter.

In some embodiments, controller 230 is used to control synchronous rectifier 216 to produced rectified voltage $V_{RX\_DC}$ from voltage $V_{108}$. Controller 230 may be implemented, e.g., as a general purpose or custom microcontroller including combinatorial logic coupled to a memory. Other implementations are also possible.

In some embodiments, controller 210 is used to control driver 214. Controller 210 may be implemented, e.g., as a general purpose or custom microcontroller including combinatorial logic coupled to a memory. Other implementations are also possible.

In some embodiments, filtering capacitor 212 may have a capacitance of, e.g., 100 µF. Other capacitances, such as higher than 100 µF (e.g., 150 µF or more) or lower than e.g., 100 µF (e.g., e.g., 90 µF or less) may also be used.

Figure 3A:
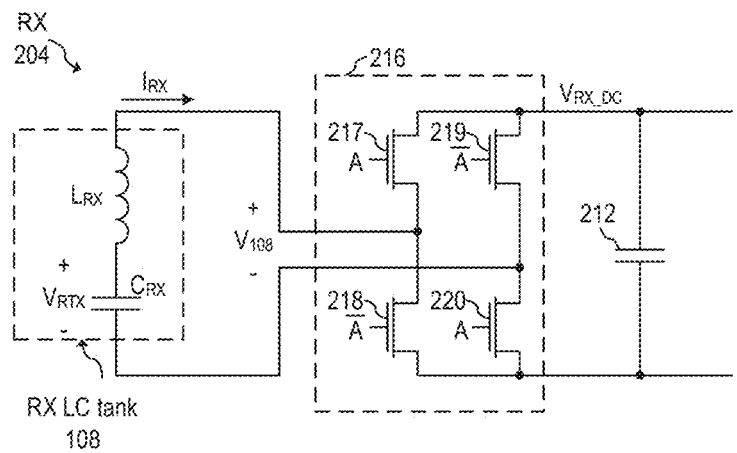
FIGS. 3A and 3B show a portion of the wireless power receiver of FIG. 2A, and associated waveforms, respectively, according to an embodiment of the present invention.
Figure 3B:
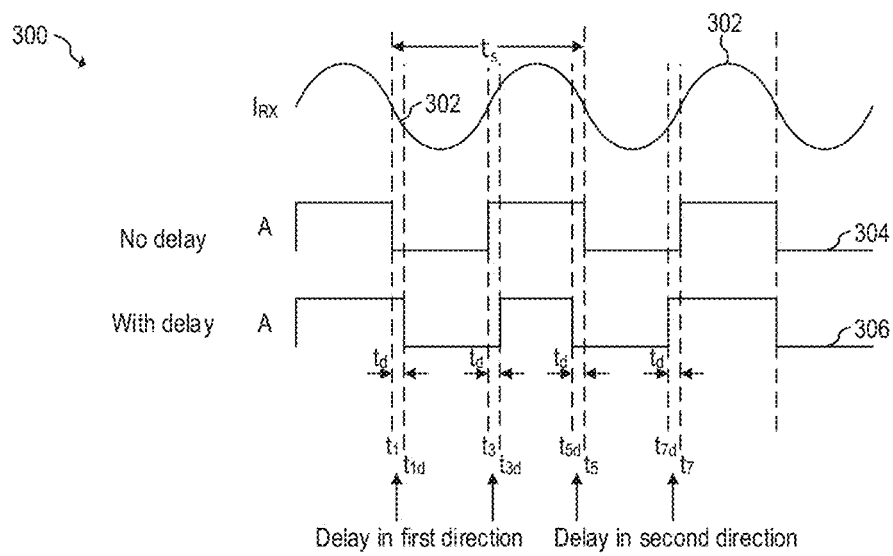

In an embodiment, the wireless power receiver (e.g., 204) transmits data to the wireless power transmitter (e.g., 202) by introducing phase shifts to the synchronous rectification switching with respect to the current zero-crossing. For example, FIGS. 3A and 3B show a portion of wireless power receiver 204, and associated waveforms 300, respectively, according to an embodiment of the present invention. For simplicity, waveforms 300 assume a dead-time of zero and avoid showing other practical details of synchronous rectification. Curve 302 shows current IRX. Curve 304 shows driving signals of transistors 217, 218, 219, and 220 for conventional synchronous rectification. Curve 306 shows driving signals of transistors 217, 218, 219, and 220 for transmitting data in-band using switching delays, according to an embodiment of the present invention.

Figure 4:
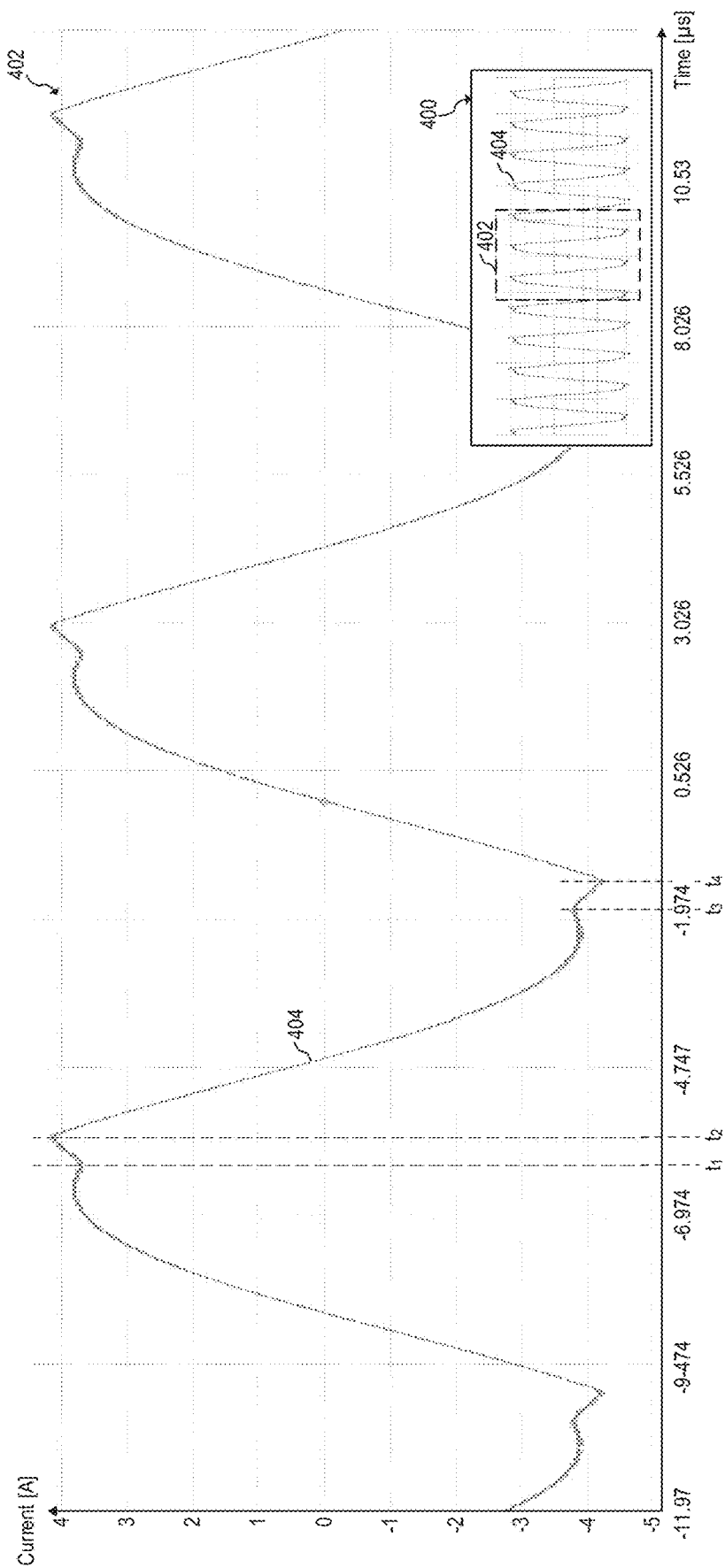
FIG. 4 shows the transmitter current $I_{TX}$ of the wireless power transmitter of FIG. 2A, according to an embodiment of the present invention.

As shown by curve 306, delays are added in a first direction (e.g., positive delay) and in a second direction (e.g., negative delay) such that the average remains with zero delay. The switching of synchronous rectifier 216 causes inflections in transmitter current $I_{TX}$ and discontinuities in the rate of change of the transmitter current $I_{TX}$, which may be easily detectable. In some embodiments, delays in the switching of the synchronous rectifier 216 are detected by wireless power transmitter 202 (e.g., by controller 210) as a delay in the position of the inflections in the transmitter current Fix or in the position of the discontinuities in the rate of change of the transmitter current $I_{TX}$ with respect with the zero-crossings of current $I_{TX}$. For example, FIG. 4 shows transmitter current $I_{TX}$ (represented by curve 404) of wireless power transmitter 202 in a zoom-out view 400 and a zoom-in view 402, according to an embodiment of the present invention. FIG. 4 may be understood in view of FIG. 3B. Curve 404 is associated with synchronous rectification with no delay applied (curve 304).

As can be seen from FIGS. 3B and 4, the synchronous switching (with no delay applied) produces inflections at times $t_1$, $t_3$, and $t_5$. At times $t_2$, $t_4$, and $t_6$, driver 214 switches. Introducing a delay $t_d$, positive or negative, delays or advances, respectively, the time location of the inflection point.

In some embodiments, transmitter 202 may detect the time location of the inflections in transmitter current $I_{TX}$, such as the time location of the inflection with respect to the magnitude of transmitter current $I_{TX}$ (e.g., the time from the peak or zero-crossing of transmitter current $I_{TX}$, or from driver 214 switching) by sampling current $I_{TX}$ using an analog-to-digital converter (ADC), at a frequency, e.g., 10 times larger than the switching frequency (e.g., at 1 MHz, or larger).

In some embodiments, wireless power transmitter 202 may detect the time location of the inflections by using a high-pass filter (analog and/or digital) to filter transmitter current $I_{TX}$. In such filtered waveform, the time location of the inflection may be associated with a sudden variation in magnitude of the filtered waveform (which may include a change in sign), followed by a flat or substantially flat portion, follows by a second sudden variation in magnitude.

In some embodiments, such as shown in FIG. 3B, the sequence of delays in a first and second directions (e.g., with the same delay $t_d$) may be used to encode information. For example, an encoding method may be, e.g., to apply the delay $t_d$ in the first direction to transmit a 1 and to apply the delay $t_d$ in the second direction to transmit a 0. In the example of FIG. 3B, the transmitted data by curve 306 applying such encoding would be the binary sequence: 1 0. However, other encoding methods, such as using symbols that use more than 1 delay instance to transmit a particular bit, may also be used.

Figure 5:
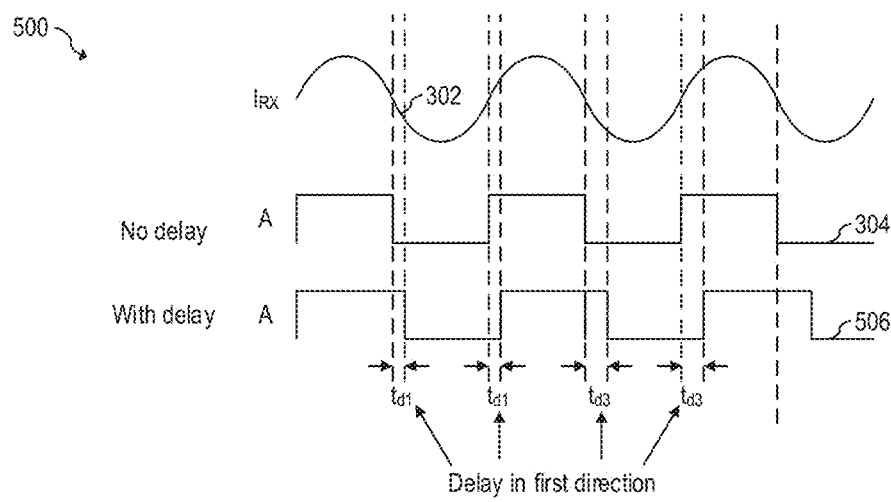
FIGS. 5-7 show waveforms associated with the wireless power receiver of FIG. 2A, according to embodiments of the present invention.

In some embodiments, the magnitude of the delay $t_d$ may be used to encode information. For example, FIG. 5 shows waveforms 500 associated with wireless power receiver 204, according to an embodiment of the present invention. As shown in FIG. 5, data may be encoded by using, e.g., two different delays $t_{d1}$ and $t_{d3}$, in the same direction. In some embodiments, more than two delays may be used to encode information, such as 3, 4, 8, or more.

In some embodiments, data may be encoded by using delays in the first and the second directions together with using more than one delay in the first and/or the second direction.

Figure 6:
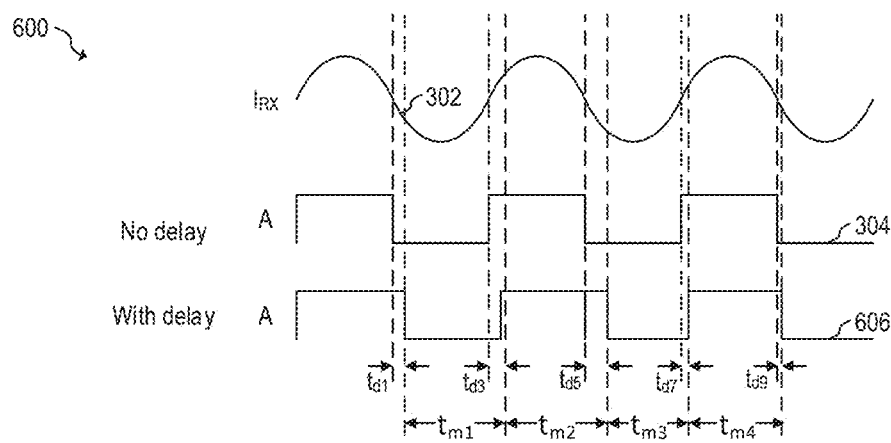

In some embodiments, the time between inflections may be used to encode information (e.g., by modulating the delay $t_d$ of the switching of synchronous rectifier 216 with respect to the zero-crossing). For example, FIG. 6 shows waveforms 600 associated with wireless power receiver 204, according to an embodiment of the present invention. As shown in FIG. 6, data may be encoded by modulating the time $t_m$ between inflections.

In some embodiments, dummy delays $t_d$ are introduced to cause the average delay over N cycles to be zero, where N is a positive integer greater than 1, such as 2, 4, or higher.

In some embodiments, the delays $t_d$ are less than 10% of the duration of the switching period $t_s$ of synchronous rectifier 216, such as 5% or less.

In some embodiments, information is transmitted from wireless power receiver 204 to wireless power transmitter 202 by switching (e.g., toggling) synchronous rectifier 216 for a short time when receiver current $I_{RX}$ is high. Such switching also causes inflections in transmitter current $I_{TX}$ and discontinuities in the rate of change of the current of the $I_{TX}$, which can be monitored by wireless power transmitter 202 to extract information received by transmitter LC tank 106. For example, FIG. 7 shows waveforms 700 associated with wireless power receiver 204, according to an embodiment of the present invention.

Figure 7:
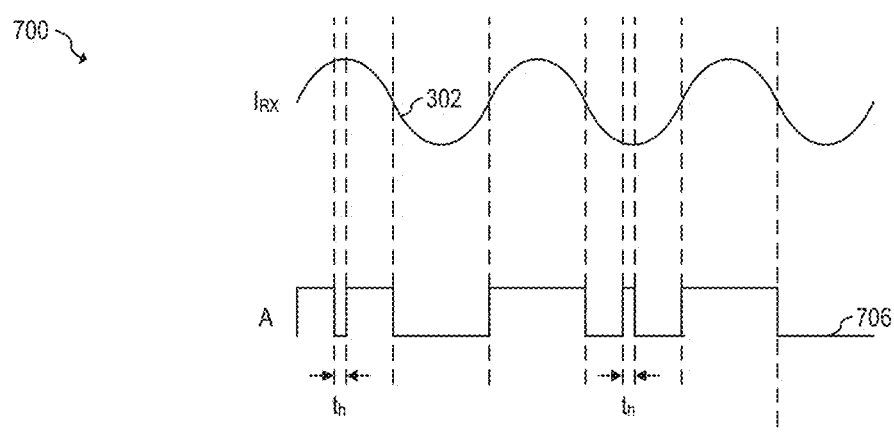

As shown in FIG. 7, inflections in the transmitter current $I_{TX}$ may be introduced when receiver current $I_{RX}$ is high, such as at or near the peak current of current $I_{RX}$ (e.g., such as 70% of the peak or higher). In some embodiments, inflections in the transmitter current $I_{TX}$ may be introduced when receiver current $I_{RX}$ is relatively low, such as between 20% and 70% of the peak (e.g., between 20% and 30% of the peak), which may advantageously reduce modulation strength and optimize system efficiency. Such additional inflections, such as the timing between inflections and/or introducing or failing to introduce additional inflections at particular cycles, may be used to encode data.

In some embodiments, the duration $t_h$ of the toggling of synchronous rectifier 216 includes the peak of receiver current $I_{RX}$. In some embodiments, the duration $t_h$ may be modulated, e.g., in a similar manner as delay $t_d$. In some embodiments, inflections introduced by using delays $t_d$ may be combined with inflections introduced by toggling synchronous rectifier 216 when current $I_{RX}$ is high to encode data.

Example embodiments of the present invention are summarized here. Other embodiments can also be understood from the entirety of the specification and the claims filed herein.

Example 1. A method for transmitting data from a wireless power receiver to a wireless power transmitter, the method including: wirelessly receiving power at a first frequency from a transmitter LC tank using a receiver LC tank; rectifying a voltage of the receiver LC tank using a rectifier; and while wirelessly receiving power, controlling a transistor coupled to the receiver LC tank to cause inflections in a transmitter current flowing through the transmitter LC tank to transmit data, detecting time locations of the inflections of the transmitter current within an oscillating cycle of the transmitter current based on a magnitude of the transmitter current, and determining the data based on the detected time locations.

Example 2. The method of example 1, where detecting the time locations of the inflections of the transmitter current based on the magnitude of the transmitter current includes detecting the time locations of the inflections of the transmitter current with respect to peaks of the transmitter current.

Example 3. The method of one of examples 1 or 2, where detecting the time locations of the inflections of the transmitter current based on the magnitude of the transmitter current includes detecting the time locations of the inflections of the transmitter current with respect to zero-crossings of the transmitter current.

Example 4. The method of one of examples 1 to 3, where detecting the time locations of the inflections of the transmitter current based on the magnitude of the transmitter current includes detecting the time locations of the inflections of the transmitter current with respect a switching event of a driver coupled to the transmitter LC tank.

Example 5. The method of one of examples 1 to 4, where determining the data based on the detected time locations includes determining the data based on the time between detected time locations.

Example 6. The method of one of examples 1 to 5, where the rectifier is a synchronous rectifier that includes the transistor.

Example 7. The method of one of examples 1 to 6, where controlling the transistor to cause inflections in the transmitter current includes delaying a switching of the synchronous rectifier by a first time.

Example 8. The method of one of examples 1 to 7, further including modulating the first time in a plurality of rectifying cycles, where determining the data based on the detected locations includes determining the data based on the magnitude of the first times.

Example 9. The method of one of examples 1 to 8, where determining the data based on the detected location includes determining the data based on a direction of the delay.

Example 10. The method of one of examples 1 to 9, where the first time is less than 10% of a duration of a switching period of the synchronous rectifier.

Example 11. The method of one of examples 1 to 10, where controlling the transistor to cause inflections in the transmitter current includes toggling the transistor when a receiver current flowing through the receiver LC tank is higher than 20% of a peak of the receiver current.

Example 12. The method of one of examples 1 to 11, where causing inflections in the transmitter current includes causing inflections in the transmitter current at a frequency higher than the first frequency.

Example 13. The method of one of examples 1 to 12, where the first frequency is about 100 kHz.

Example 14. The method of one of examples 1 to 13, where the first frequency is between 80 kHz and 300 kHz.

Example 15. A method for transmitting data from a wireless power receiver to a wireless power transmitter, the method including: wirelessly receiving power using a receiver LC tank from a transmitter LC tank; rectifying a voltage of the receiver LC tank using a synchronous rectifier; and transmitting data from the wireless power receiver to the wireless power transmitter by delaying a switching of the synchronous rectifier by a first time.

Example 16. The method of example 15, where transmitting data from the wireless power receiver to the wireless power transmitter further includes toggling a transistor of the synchronous rectifier when a receiver current flowing through the receiver LC tank is at least 20% of a peak of the receiver current.

Example 17. The method of one of examples 15 or 16, where toggling the transistor includes toggling the transistor for a duration that is lower than 10% of a switching period of the synchronous rectifier.

Example 18. The method of one of examples 15 to 17, where the first time is negative.

Example 19. A wireless power receiver including: a receiver LC tank configured to receive power from a wireless power transmitter; a synchronous rectifier coupled to the receiver LC tank; and a controller configured to operate the synchronous rectifier to rectify a voltage across terminals of the receiver LC tank to produce a rectified voltage, and to transmit data to the wireless power transmitter by delaying or advancing a switching of the synchronous rectifier by a first time.

Example 20. The wireless power receiver of example 19, where the controller is further configured to transmit data to the wireless power transmitter by toggling a transistor of the synchronous rectifier when a receiver current flowing through the receiver LC tank is at least 20% of a peak of the receiver current.

Example 21. The wireless power receiver of one of examples 19 or 20, further including a filtering capacitor coupled to an output of the synchronous rectifier, the filtering capacitor configured to filter noise at a frequency of data transmission.

Example 22. The wireless power receiver of one of examples 19 to 21, where the controller is configured to transmit data to the wireless power transmitter by modulating the first time over a plurality of switching cycles of the synchronous rectifier.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for transmitting data from a wireless power receiver to a wireless power transmitter, the method comprising:
   wirelessly receiving power at a first frequency from a transmitter LC tank using a receiver LC tank;
   rectifying a voltage of the receiver LC tank using a rectifier; and
   while wirelessly receiving power,
      controlling a transistor coupled to the receiver LC tank to cause inflections in a transmitter current flowing through the transmitter LC tank to transmit data,
      detecting time locations of the inflections of the transmitter current within an oscillating cycle of the transmitter current based on a magnitude of the transmitter current, and
      determining the data based on the detected time locations.

2. The method of claim 1, wherein detecting the time locations of the inflections of the transmitter current based on the magnitude of the transmitter current comprises detecting the time locations of the inflections of the transmitter current with respect to peaks of the transmitter current.

3. The method of claim 1, wherein detecting the time locations of the inflections of the transmitter current based on the magnitude of the transmitter current comprises detecting the time locations of the inflections of the transmitter current with respect to zero-crossings of the transmitter current.

4. The method of claim 1, wherein detecting the time locations of the inflections of the transmitter current based on the magnitude of the transmitter current comprises detecting the time locations of the inflections of the transmitter current with respect a switching event of a driver coupled to the transmitter LC tank.

5. The method of claim 1, wherein determining the data based on the detected time locations comprises determining the data based on the time between detected time locations.

6. The method of claim 1, wherein the rectifier is a synchronous rectifier that comprises the transistor.

7. The method of claim 6, wherein controlling the transistor to cause inflections in the transmitter current comprises delaying a switching of the synchronous rectifier by a first time.

8. The method of claim 7, further comprising modulating the first time in a plurality of rectifying cycles, wherein determining the data based on the detected locations comprises determining the data based on the magnitude of the first times.

9. The method of claim 7, wherein determining the data based on the detected location comprises determining the data based on a direction of the delay.

10. The method of claim 7, wherein the first time is less than 10% of a duration of a switching period of the synchronous rectifier.

11. The method of claim 6, wherein controlling the transistor to cause inflections in the transmitter current comprises toggling the transistor when a receiver current flowing through the receiver LC tank is higher than 20% of a peak of the receiver current.

12. The method of claim 1, wherein causing inflections in the transmitter current comprises causing inflections in the transmitter current at a frequency higher than the first frequency.

13. The method of claim 1, wherein the first frequency is about 100 kHz.

14. The method of claim 1, wherein the first frequency is between 80 kHz and 300 kHz.

15. A method for transmitting data from a wireless power receiver to a wireless power transmitter, the method comprising:

wirelessly receiving power using a receiver LC tank from a transmitter LC tank;
rectifying a voltage of the receiver LC tank using a synchronous rectifier; and
transmitting data from the wireless power receiver to the wireless power transmitter by delaying a switching of the synchronous rectifier by a first time.

16. The method of claim 15, wherein transmitting data from the wireless power receiver to the wireless power transmitter further comprises toggling a transistor of the synchronous rectifier when a receiver current flowing through the receiver LC tank is at least 20% of a peak of the receiver current.

17. The method of claim 16, wherein toggling the transistor comprises toggling the transistor for a duration that is lower than 10% of a switching period of the synchronous rectifier.

18. The method of claim 16, wherein the first time is negative.

19. A wireless power receiver comprising:
a receiver LC tank configured to receive power from a wireless power transmitter;
a synchronous rectifier coupled to the receiver LC tank; and
a controller configured to operate the synchronous rectifier to rectify a voltage across terminals of the receiver LC tank to produce a rectified voltage, and to transmit data to the wireless power transmitter by delaying or advancing a switching of the synchronous rectifier by a first time.

20. The wireless power receiver of claim 19, wherein the controller is further configured to transmit data to the wireless power transmitter by toggling a transistor of the synchronous rectifier when a receiver current flowing through the receiver LC tank is at least 20% of a peak of the receiver current.

21. The wireless power receiver of claim 19, further comprising a filtering capacitor coupled to an output of the synchronous rectifier, the filtering capacitor configured to filter noise at a frequency of data transmission.

22. The wireless power receiver of claim 19, wherein the controller is configured to transmit data to the wireless power transmitter by modulating the first time over a plurality of switching cycles of the synchronous rectifier.

* * * * *